US012812846B2

(12) United States Patent
Hamada et al.

(10) Patent No.: US 12,812,846 B2
(45) Date of Patent: Nov. 24, 2026

(54) DRAM INTERCONNECTS OVER CIRCUIT REGION

(71) Applicant: MICRON TECHNOLOGY, INC., Boise, ID (US)

(72) Inventors: Takayori Hamada, Sagamihara (JP); Yasuhiko Tanuma, Sagamihara (JP)

(73) Assignee: Micron Technology, Inc., Boise, ID (US)

(*) Notice: Subject to any disclaimer, the term of this patent is extended or adjusted under 35 U.S.C. 154(b) by 337 days.

(21) Appl. No.: 18/739,712

(22) Filed: Jun. 11, 2024

(65) Prior Publication Data

US 2025/0016999 A1 Jan. 9, 2025

Related U.S. Application Data

(60) Provisional application No. 63/512,116, filed on Jul. 6, 2023.

(51) Int. Cl.
*H10B 12/00* (2023.01)

(52) U.S. Cl.
CPC .................................... *H10B 12/50* (2023.02)

(58) Field of Classification Search
CPC ..... G11C 11/401–4099; G11C 14/0009–0045; G11C 2211/4016; H10B 12/00–50
See application file for complete search history.

(56) References Cited

U.S. PATENT DOCUMENTS

2020/0219804 A1* 7/2020 Jezewski ............. H10D 30/477

* cited by examiner

*Primary Examiner* — Wasiul Haider
(74) *Attorney, Agent, or Firm* — Dorsey & Whitney LLP

(57) ABSTRACT

An apparatus includes: a circuit region; a first global wiring extending over the circuit region, the first global wiring being divided, at least in part, into a first main wiring and a first branched wiring over the circuit region; and a second global wiring arranged adjacently to the first global wiring and extending in parallel to the first global wiring, the second global wiring being divided, at least in part, into a second main wiring and a second branched wiring over the circuit region. The first branched wiring extends between the second main wiring and the second branched wiring. The second branched wiring extends between the first main wiring and the first branched wiring.

20 Claims, 4 Drawing Sheets

DRAM INTERCONNECTS OVER CIRCUIT REGION

CROSS REFERENCE TO RELATED APPLICATION(S)

This application claims priority to U.S. Provisional Application No. 63/512,116, filed Jul. 6, 2023. The aforementioned application is incorporated herein by reference, in its entirety, for any purpose.

BACKGROUND

Recently, in semiconductor devices such as dynamic random access memory (DRAM), increased memory capacity is desired, and the number of memory elements being put into memory chips is increasing. For this reason, the number of circuits for driving the memory elements is also increasing, and therefore power consumption in the circuit regions is rising. Also, design constraints may create difficulties in freely arranging the wiring for supplying power in some cases. Consequently, in some cases, it is difficult to supply power evenly to the circuit regions arranged in a memory chip.

DETAILED DESCRIPTION

Figure 1:
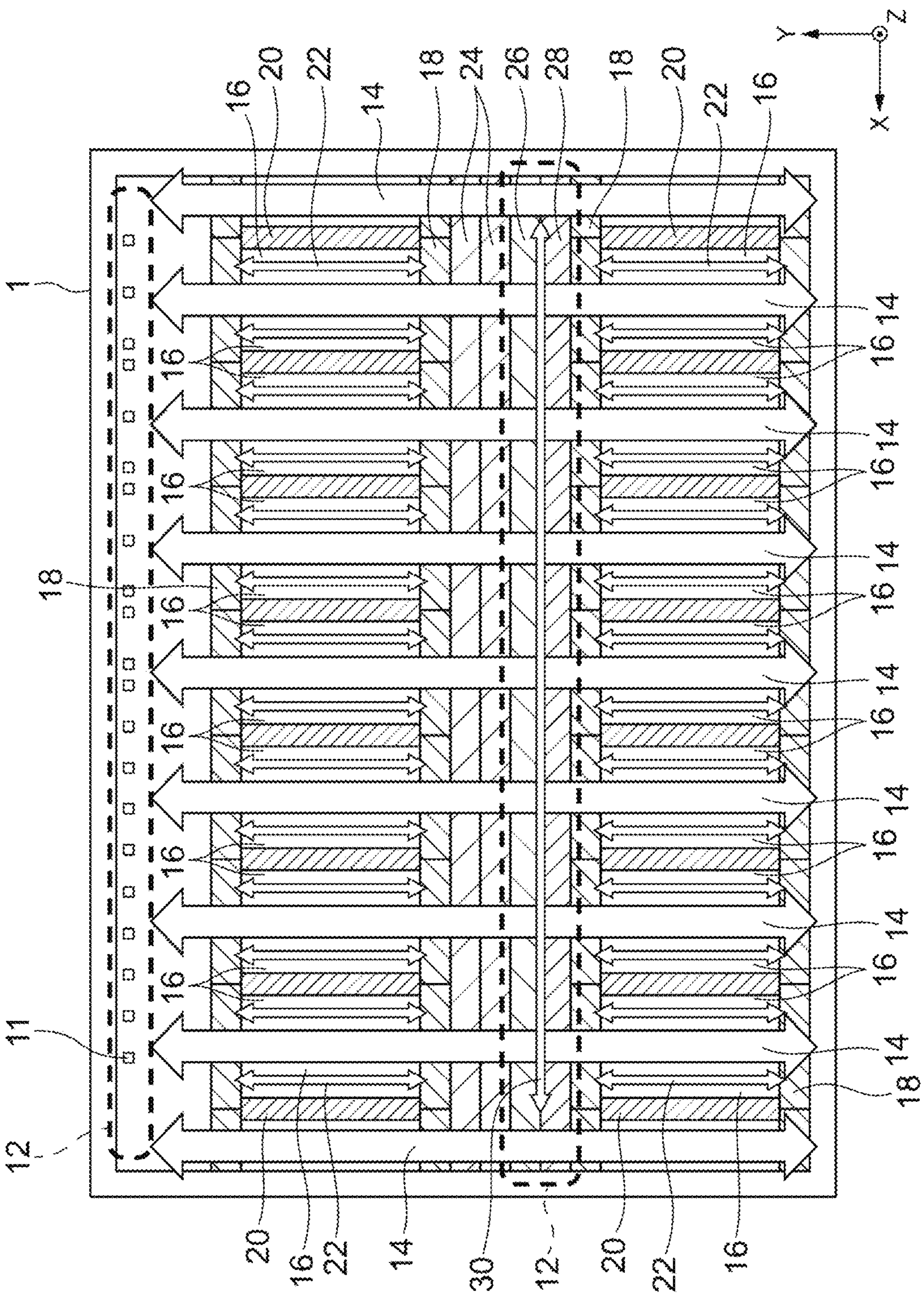
FIG. 1 is a plan view illustrating a schematic configuration of a semiconductor device according to an embodiment.

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Hereinafter, a semiconductor device according to the embodiment will be described with reference to the drawings. In the description of the embodiment, common or related elements and elements that are substantially the same are denoted with the same signs, and the description thereof will be reduced or omitted. In the drawings referenced hereinafter, the dimensions and dimensional ratios of each unit in each of the drawings do not necessarily match the actual dimensions and dimensional ratios in the embodiment. Furthermore, in the following description, the Y direction is the direction at a right angle to the X direction. The Z direction is the direction at a right angle to the X-Y plane defined as the plane of a semiconductor substrate, and is also referred to as the vertical direction.

Hereinafter, the semiconductor device according to the embodiment will be described. In the following description, dynamic random access memory (DRAM) is described as an example. Examples of DRAM include synchronous DRAM (SDRAM), Double Data Rate (DDR) SDRAM, Double Data Rate 2 (DDR2) SDRAM, and Double Data Rate 3 (DDR3) SDRAM. FIG. 1 schematically illustrates an example of a plan layout on a single DRAM chip.

As illustrated in FIG. 1, a semiconductor device 1 is rectangular overall, with the long edge running in the X direction. As described later, the semiconductor device 1 is formed on a semiconductor substrate. The semiconductor device 1 has a circuit region 12 provided with a plurality of power pads 11 along one long edge. The power pads 11 are connected by bonding in a back-end process of the process for manufacturing the semiconductor device 1, and electrically connected to a memory controller when the semiconductor device 1 is incorporated into a computer system. Power lines for driving the semiconductor device 1 are connected to the power pads 11.

The semiconductor device 1 is provided with a plurality of memory banks 16. The memory banks 16 are arranged in a matrix on the semiconductor substrate. The memory banks 16 contain a plurality of memory cells. Column decoders 18 and row decoders 20 are arranged around the memory banks 16. The column decoders 18 and row decoders 20 generate control signals that control operations such as writing, reading, and refreshing data in the memory cells.

In the center of the Y direction of the semiconductor device 1, bank logic 24, an error correction code (ECC)/bus buffer 26, and a data sense amplifier 28 are arranged extending in the X direction. The ECC/bus buffer 26 and the data sense amplifier 28 have high power consumption. The region where the ECC/bus buffer 26 and data sense amplifier 28 with high power consumption are arranged is designated the circuit region 12. A region where circuits different from the circuit region 12 are arranged is provided in the region adjacent to the circuit region 12.

The semiconductor device 1 is provided with a plurality of global wirings 14. As illustrated in FIG. 1, the global wirings 14 are arranged parallel to each other in the X direction and extending in the Y direction. The global wirings 14 are each connected to the power pads 11, running the length of the semiconductor device 1 in the Y direction and extending to the edge on the opposite side from the power pads 11 in the Y direction. Wirings, not illustrated, in the same layer as the global wirings 14 and local wirings 22 provided in a different layer may be provided between adjacent global wirings 14. For this reason, the layout that extends in the Y direction is adopted for the global wirings 14.

Figure 2:
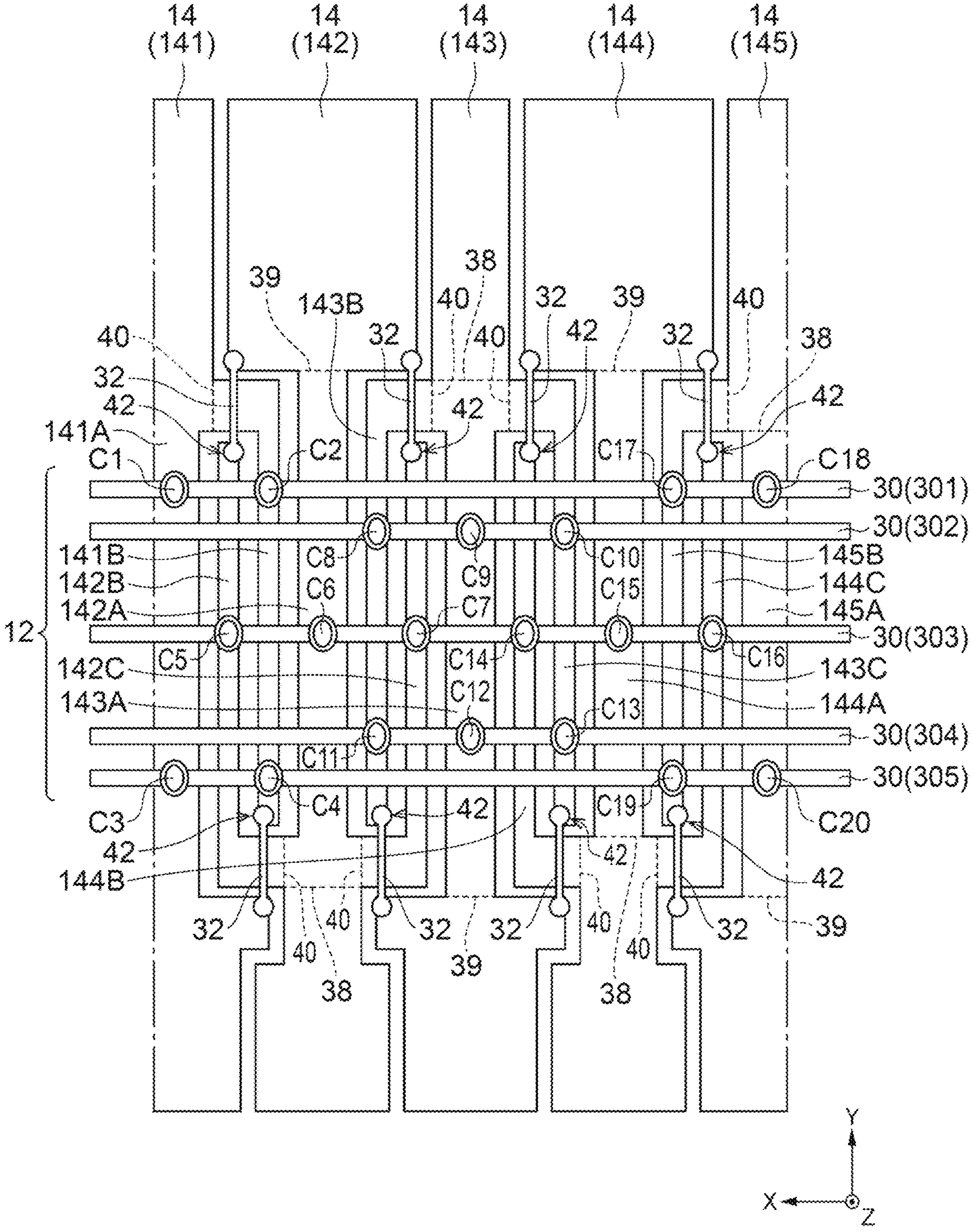
FIG. 2 is a plan view illustrating a schematic configuration of a semiconductor device according to the embodiment.
Figure 3:
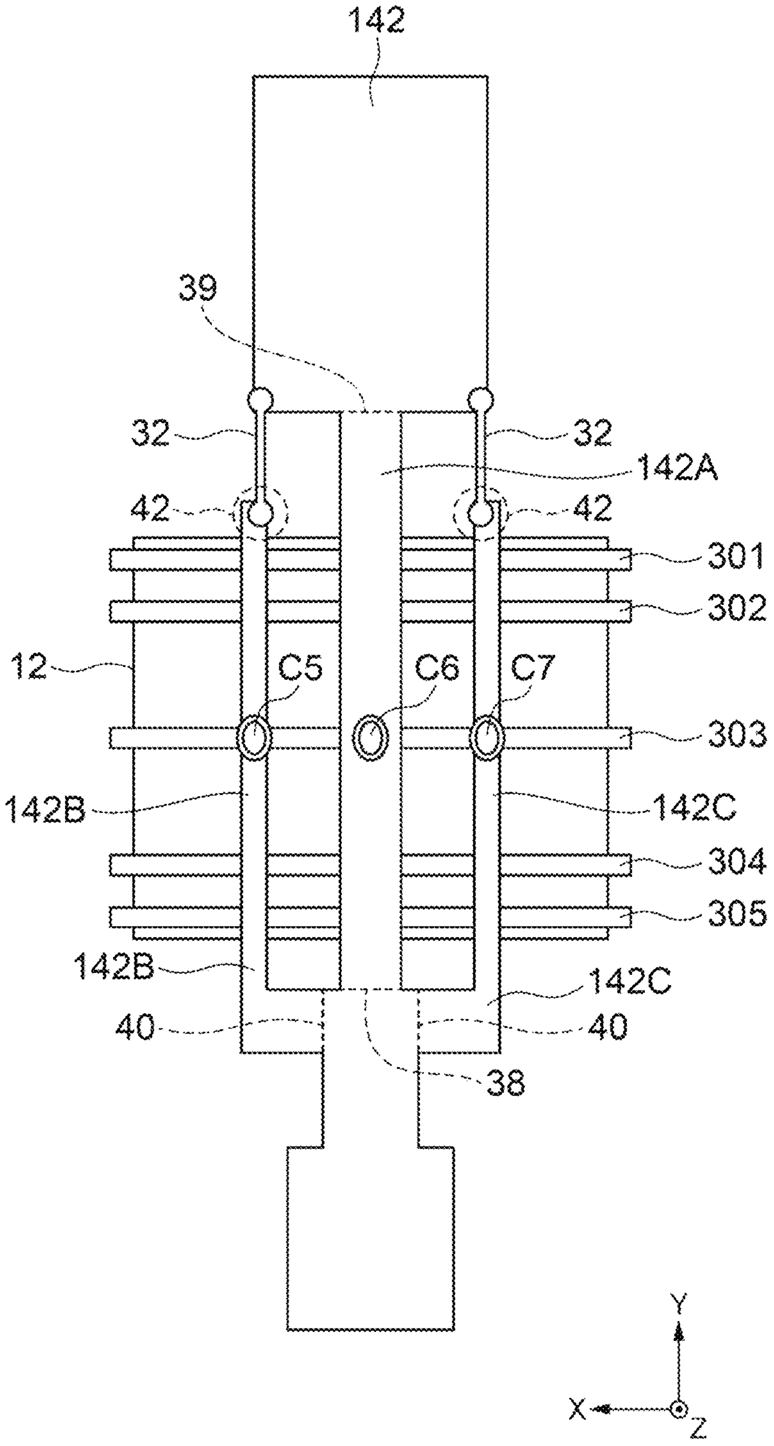
FIG. 3 is a plan view illustrating a schematic configuration of a semiconductor device according to the embodiment.
Figure 4:
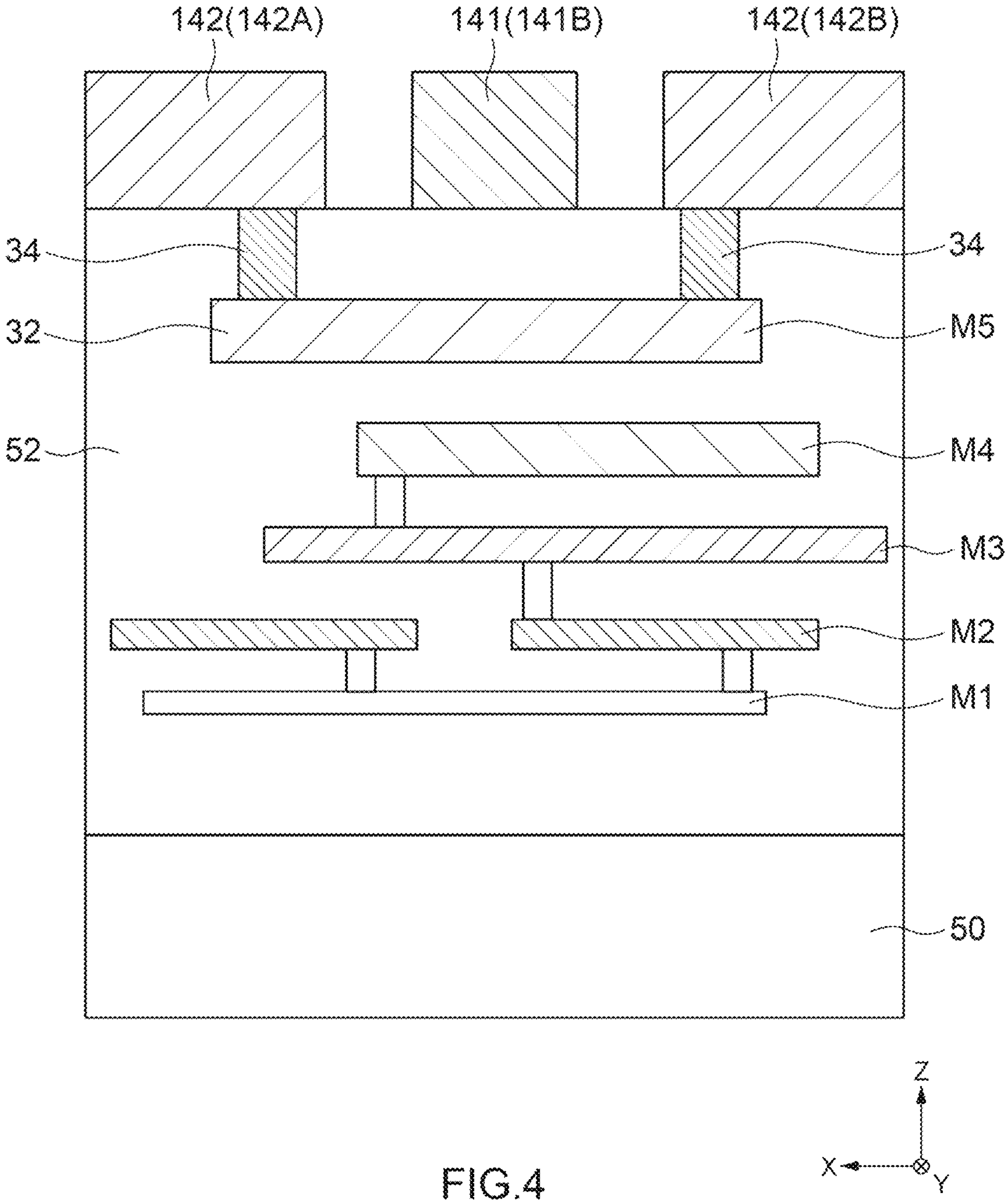
FIG. 4 is a longitudinal section illustrating a schematic configuration of a semiconductor device according to the embodiment.

Next, FIGS. 2, 3, and 4 will be referenced to describe a detailed configuration of the global wirings 14. FIG. 2 is a schematic plan view illustrating an enlarged view of the region where the global wirings 14 and the circuit region 12 overlap. As illustrated in FIG. 2, a plurality of global wirings 14 are arranged. The global wirings 14 are each connected to a different power pad 11 and are connected at different potentials.

In FIG. 2, the plurality of global wirings 14 are illustrated as a first global wiring 141, a second global wiring 142, a third global wiring 143, a fourth global wiring 144, and a fifth global wiring 145, in order from the left side of the diagram. The plurality of global wirings 14 extend in the Y direction so as to overlap and straddle over the circuit region 12. The first global wiring 141, second global wiring 142, third global wiring 143, fourth global wiring 144, and fifth global wiring 145 are included in the same wiring layer.

Above the circuit region 12, a plurality of sub-global wirings 30 extending in the X direction are arranged. In FIG. 2, the plurality of sub-global wirings 30 are illustrated as a first sub-global wiring 301, a second sub-global wiring 302, a third sub-global wiring 303, a fourth sub-global wiring 304, and a fifth sub-global wiring 305.

As described hereinafter, the global wirings 14 are each provided with a main wiring and branched wirings. As illustrated in FIG. 2, the global wirings 14 (141, 142, 143, 144, 145) are provided with main wirings 141A, 142A, 143A, 144A, and 145A, respectively. Also, the global wirings 14 (141, 142, 143, 144, 145) are provided with branched wirings 141B, 142B and 142C, 143B and 143C, 144B and 144C, and 145B and 145C, respectively. Each of the global wirings 14 (141, 142, 143, 144, 145) are divided, at least in part, into the main wirings 141A, 142A, 143A, 144A, and 145A and the branched wirings 141B, 142B, 142C, 143B, 143C, 144B, 144C, 145B, and 145C over the circuit region 12.

The main wirings 141A, 142B, 143A, 144A, and 145A are connected to the global wirings 14 at connecting portions 38 and 39. The branched wirings 141B, 142B, 142C, 143B, 143C, 144B, 144C, 145B, and 145C branch from the global wirings 14 at branch portions 40. The global wirings 14 (141, 142, 143, 144, 145) are not provided with branched wirings over another region adjacent to the circuit region 12.

The first global wiring 141 and the fifth global wiring 145 are connected to the same potential. The second global wiring 142 and the fourth global wiring 144 are connected to the same potential. The global wirings 141 and 145 are connected to a different potential from that of the global wirings 142, 143, and 144. The global wirings 142 and 144 are connected to a different potential from that of the third global wiring 143.

The main wiring 141A and branched wiring 141B of the first global wiring 141 are connected to the sub-global wirings 301 and 305 via contact plugs C1, C2, C3, and C4. The main wiring 145A and branched wiring 145B of the fifth global wiring 145 are connected to the sub-global wirings 301 and 305 via contact plugs C17, C18, C19, and C20. The first sub-global wiring 301 and the fifth sub-global wiring 305 are connected to the same potential.

The main wiring 142A and branched wirings 142B, 142C of the second global wiring 142 are connected to the third sub-global wiring 303 via contact plugs C5, C6, and C7. The main wiring 144A and branched wirings 144B, 144C of the fourth global wiring 144 are connected to the third sub-global wiring 303 via contact plugs C14, C15, and C16.

The main wiring 143A and branched wirings 143B, 143C of the third global wiring 143 are connected to the second sub-global wiring 302 and the fourth sub-global wiring 304 via contact plugs C8, C9, C10, C11, C12, and C13. The second sub-global wiring 302 and the fourth sub-global wiring 304 are connected to the same potential.

The main wirings 141A, 142A, 143A, 144A, 145A and the branched wirings 141B, 142B, 142C, 143B, 143C, 144B, 144C, 145B are each provided with at least one contact plug. This arrangement allows for a voltage to be supplied to the circuit region 12 through each of the sub-global wirings 30.

Between the main wiring 141A and the branched wiring 141B of the first global wiring 141, the branched wiring 142B of the adjacent second global wiring 142 is disposed. Between the main wiring 142A and the branched wiring 142B of the second global wiring 142, the branched wiring 141B of the adjacent first global wiring 141 is disposed. Between the main wiring 142A and the branched wiring 142C of the second global wiring 142, the branched wiring 143B of the adjacent third global wiring 143 is disposed.

Between the main wiring 143A and the branched wiring 143B of the third global wiring 143, the branched wiring 142C of the adjacent second global wiring 142 is disposed. Between the main wiring 143A and the branched wiring 143C of the third global wiring 143, the branched wiring 144B of the adjacent fourth global wiring 144 is disposed.

Between the main wiring 144A and the branched wiring 144B of the fourth global wiring 144, the branched wiring 143C of the adjacent third global wiring 143 is disposed. Between the main wiring 144A and the branched wiring 144C of the fourth global wiring 144, the branched wiring 145B of the adjacent fifth global wiring 145 is disposed. Between the main wiring 145A and the branched wiring 145B of the fifth global wiring 145, the branched wiring 144C of the adjacent fourth global wiring 144 is disposed.

In this way, between the main wirings 141A, 142A, 143A, 144A, 145A of each of the global wirings 14 and the branched wirings 141B, 142B, 142C, 143B, 143C, 144B, 144C, 145B corresponding to each of the global wirings 14, distance sufficient to dispose the adjacent branched wirings 142B, 142C, 143B, 143C, 144B, 144C is provided.

FIG. 3 is a diagram illustrating the second global wiring 142 among the plurality of global wirings 14 illustrated in FIG. 2. The global wirings 141, 142, 143, 144, 145 have substantially the same configuration. Consequently, the description regarding the second global wiring 142 also applies to the global wirings 141, 143, 144, 145. Each of tips 42 of the branched wirings 141B, 142B, 142C, 143B, 143C, 144B, 144C, 145B is coupled to a corresponding global wiring 141, 142, 143, 144, 145 by way of a corresponding supplemental wiring 32.

As illustrated in FIG. 3, the branched wirings 142B and 142C of the second global wiring 142 branch from the main wiring 142A at a branch portion 40. The main wiring 142A is connected to the branched wirings 142B and 142C at the branch portion 40. The branch portion 40 is located on the border on one side of the circuit region 12 in the Y direction.

In FIG. 3, the branch portion 40 is disposed nearer on the near side in the Y direction than the circuit region 12. The branched wiring 142B and the branched wiring 142C extend in the Y direction, and in FIG. 3, the tips 42 thereof are disposed farther on the far side in the Y direction than the circuit region 12. The tips 42 are located on the border on the other side of the circuit region 12 in the Y direction.

The circuit region 12 is flanked by the branch portion 40 and the tips 42. The tip 42 of the branched wiring 142B and the tip 42 of the branched wiring 142C are coupled to the second global wiring 142 via supplemental wirings 32.

The global wirings 141, 143, 144, 145 also have a structure similar to the second global wiring 142 described above. That is, the branched wirings 141B, 141C, 143B, 143C, 144B, 144C, 145B branch from each of the global wirings 141, 142, 143, 144, 145 at a branch portion 40 corresponding to each. The tips 42 and branch portions 40 corresponding to each of the branched wirings 141B, 141C, 143B, 143C, 144B, 144C, 145B flank the circuit region 12.

Next, FIG. 4 will be referenced to describe the structure around the supplemental wiring 32. As illustrated in FIG. 4, the second global wiring 142 and the branched wiring 142B are coupled at the tip 42 via the supplemental wiring 32. The second global wiring 142 and the tip 42 of the branched wiring 142B are connected via a contact plug 34. The contact plug 34 may be formed as an integral part of the second global wiring 142.

Below the first global wiring 141 and the second global wiring 142, five wiring layers, namely a first layer M1, a second layer M2, a third layer M3, a fourth layer M4, and a fifth layer M5 are provided, for example. The first layer M1, second layer M2, third layer M3, fourth layer M4, and fifth layer M5 are provided within an insulating film 52 provided on top of a semiconductor substrate 50. The first global wiring 141 and the second global wiring 142 are provided on top of the insulating film 52.

The fifth layer M5 is located in the uppermost layer among the wiring layers disposed in the layers below the wiring layer where the first global wiring 141 and the second global wiring 142 are provided. The supplemental wiring 32 is included in the fifth layer M5. The supplemental wiring 32 is provided in a different wiring layer from the first global wiring 141 and the second global wiring 142. FIG. 4 illustrates an example in which the supplemental wiring 32 is formed in the fifth layer M5, but the configuration is not necessarily limited thereto.

As illustrated in FIG. 4, the branched wiring 141B of the first global wiring 141 adjacent to the second global wiring 142 is provided above the supplemental wiring 32. The first global wiring 141 and the second global wiring 142 are formed in the same wiring layer. Accordingly, to dispose the branched wiring 141B between the main wiring 142A and the branched wiring 142B, the branched wiring 141B must be extended past the second global wiring 142. In the embodiment, by forming the supplemental wiring 32 in a different wiring layer from the global wirings 14, the branched wiring 141B can be passed over the supplemental wiring 32, thereby allowing the branched wiring 141B to be disposed between the main wiring 142A and the branched wiring 142B.

As described above, the second global wiring 142 is divided into multiple branches over the circuit region 12. For this reason, the contact plugs C5, C6, and C7 can be dispersed in the X direction. Consequently, the contact plugs connected to the sub-global wirings 30 can be disposed more uniformly and variations in the voltages supplied to the sub-global wirings 30 can be suppressed. The second global wiring 142 is not divided into multiple branches in the regions outside of the circuit region 12.

The tips 42 of the branched wirings 142B and 142C are coupled to the second global wiring 142 by way of the supplemental wirings 32. For this reason, voltage drops in the branched wirings 142B and 142C can be suppressed, and therefore variations in the voltages supplied to the sub-global wirings 30 can be suppressed.

The global wirings 141, 143, 144, 145 also have substantially the same configuration as the second global wiring 142 described above. In other words, the global wirings 141, 142, 143, 144, 145 are divided into multiple branches over the circuit region 12. For this reason, the contact plugs C1 to C20 can be dispersed in the X direction. Consequently, the contact plugs connected to the sub-global wirings 30 can be disposed more uniformly and variations in the voltages supplied to the sub-global wirings 30 can be suppressed. With this arrangement, drive variations in circuits connected to the sub-global wirings 30 are suppressed, thereby enabling more stable device operation. Note that the global wirings 141, 142, 143, 144, 145 are not divided into multiple branches in the regions outside of the circuit region 12.

Likewise, in the global wirings 141, 142, 143, 144, 145, the tips 42 of each of the branched wirings 141B, 142B, 142C, 143B, 143C, 144B, 144C, and 145C are coupled to the global wirings 141, 142, 143, 144, 145 by way of the corresponding supplemental wirings 32. For this reason, voltage drops in the branched wirings 141B, 142B, 142C, 143B, 143C, 144B, 144C, and 145C can be suppressed, and therefore variations in the voltages supplied to the sub-global wirings 30 can be suppressed. With this arrangement, drive variations in circuits coupled to the sub-global wirings 30 are suppressed, thereby enabling more stable device operation.

As above, DRAM is described as an example of the semiconductor device according to the embodiment, but the above description is merely one example and not intended to be limited to DRAM. Memory devices other than DRAM, such as static random-access memory (SRAM), flash memory, erasable programmable read-only memory (EPROM), magnetoresistive random-access memory (MRAM), and phase-change memory for example can also be applied as the semiconductor device. Furthermore, devices other than memory, including logic ICs such as a microprocessor and an application-specific integrated circuit (ASIC), for example, are also applicable as the semiconductor device according to the foregoing embodiment.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:

a circuit region;

a first global wiring extending over the circuit region, the first global wiring being divided, at least in part, into a first main wiring and a first branched wiring over the circuit region; and a second global wiring arranged adjacently to the first global wiring and extending in parallel to the first global wiring, the second global wiring being divided, at least in part, into a second main wiring and a second branched wiring over the circuit region;

wherein the first branched wiring extends between the second main wiring and the second branched wiring; and wherein the second branched wiring extends between the first main wiring and the first branched wiring.

2. The apparatus of claim 1, wherein voltages different from each other are supplied to the first global wiring and the second global wiring.

3. The apparatus of claim 1, wherein the first global wiring and the second global wiring have no branched wiring over regions adjacent to the circuit region.

4. The apparatus of claim 1, wherein each of the first main wiring and the first branched wiring of the first global wiring is provided in a first wiring layer.

5. The apparatus of claim 1, wherein each of the second main wiring and the second branched wiring of the second global wiring is provided in a first wiring layer.

6. The apparatus of claim 1, wherein each of the first main wiring, the first branched wiring of the first global wiring, the second main wiring and the second branched wiring of the second global wiring is provided in a first wiring layer.

7. The apparatus of claim 6, wherein the first branched wiring has a tip, and the tip is coupled to the first global wiring by way of a supplemental wiring provided in a second wiring layer different from the first wiring layer.

8. The apparatus of claim 1, wherein at least one contact plug is provided on each of the first and second main wirings and the first and second branched wirings to supply voltage to the circuit region.

9. The apparatus of claim 1, wherein at least one contact plug is provided on each of the first, second and third main wirings and the first, second, third, fourth, fifth and sixth branched wirings to supply respective voltages to the circuit region.

10. An apparatus comprising:

a circuit region;

a first global wiring extending over the circuit region, the first global wiring being divided, at least in part, into a first branched wiring, a second branched wiring and a first main wiring therebetween over the circuit region;

a second global wiring arranged adjacently to the first global wiring in one side of the first global wiring and extending in parallel to the first global wiring, the second global wiring being divided, at least in part, into a third branched wiring, a fourth branched wiring and a second main wiring therebetween over the circuit region;

a third global wiring arranged adjacently to the first global wiring in the other side of the first global wiring and extending in parallel to the first global wiring, the third global wiring being divided, at least in part, into a fifth branched wiring, a sixth branched wiring and a third main wiring therebetween over the circuit region;

wherein the first branched wiring extends between the second main wiring and the fourth branched wiring; and wherein the second branched wiring extends between the third main wiring and the fifth branched wiring.

11. The apparatus of claim 10, wherein voltages different from each other are supplied to the first global wiring, the second global wiring and the third global wiring.

12. The apparatus of claim 10, wherein the first global wiring, the second global wiring and the third global wiring have no branched wiring over regions adjacent to the circuit region.

13. The apparatus of claim 10, wherein each of the first main wiring, the first branched wiring and the second branched wiring of the first global wiring is provided in a first wiring layer.

14. The apparatus of claim 10, wherein each of the second main wiring, the third branched wiring and the fourth branched wiring of the second global wiring is provided in a first wiring layer.

15. The apparatus of claim 10, wherein each of the third main wiring, the fifth branched wiring and the sixth branched wiring of the third global wiring is provided in a first wiring layer.

16. The apparatus of claim 10, wherein each of the first main wiring, the first branched wiring, the second branched wiring, the second main wiring, the third branched wiring, the fourth branched wiring, the third main wiring, the fifth branched wiring and the sixth branched wiring is provided in a first wiring layer.

17. The apparatus of claim 16, wherein the first, second, third, fourth, fifth and sixth branched wirings have tips, respectively, wherein each of the tips of the first and second branched wiring is coupled to the first global wiring by way of a first supplemental wiring in a second wiring layer different from the first wiring layer;

wherein each of the tips of the third and fourth wiring is coupled to the second global wiring by way of a second supplemental wiring in the second wiring layer; and wherein each of the tips of the fifth and sixth wiring is coupled to the third global wiring by way of a third supplemental wiring in the second wiring layer.

18. An apparatus comprising:

a circuit region;

a first global wiring extending over the circuit region, the first global wiring provided in a first wiring layer;

a second global wiring arranged adjacently to the first global wiring and extending in parallel to the first global wiring, the second global wiring provided in the first wiring layer;

a first branched wiring having a first branch portion branching from the first global wiring and a first connecting portion connected to the first global wiring with the first branched wiring, the first branched wiring extending parallel to the first global wiring at least over the circuit region;

a second branched wiring having a second branch portion branching from the second global wiring and a second connecting portion connected to the second global wiring with the second branched wiring, the second branched wiring extending parallel to the second global wiring at least over the circuit region;

wherein the first branched wiring extends between the second global wiring and the second branched wiring; and wherein the second branched wiring extends between the first global wiring and the first branched wiring.

19. The apparatus of claim 18, further comprising a first supplemental wiring coupling the first global wiring and the first branched wiring in the first connecting portion, and provided in a second wiring layer different from the first wiring layer;

wherein the second branched wiring is arranged to overlap the first supplemental wiring.

20. The apparatus of claim 18, further comprising a second supplemental wiring coupling the second global wiring and the second branched wiring in the second connecting portion, and provided in a second wiring layer different from the first wiring layer;

wherein the first branched wiring is arranged to overlap the second supplemental wiring.

* * * * *